US009295178B1

(12) United States Patent
Aldea et al.

(10) Patent No.: US 9,295,178 B1
(45) Date of Patent: Mar. 22, 2016

(54) LOW PROFILE COMPLIANT LATCH ASSEMBLY AND ELECTRONIC CIRCUIT CARD AND CHASSIS INCORPORATING SAME

(71) Applicants: Victor Aldea, Ottawa (CA); Mitch O'Leary, Ottawa (CA)

(72) Inventors: Victor Aldea, Ottawa (CA); Mitch O'Leary, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 14/469,735

(22) Filed: Aug. 27, 2014

(51) Int. Cl.
*H05K 5/00* (2006.01)
*H05K 7/14* (2006.01)
*F16B 2/10* (2006.01)
*F16B 2/18* (2006.01)

(52) U.S. Cl.
CPC .............. *H05K 7/1417* (2013.01); *F16B 2/10* (2013.01); *F16B 2/185* (2013.01); *H05K 5/0026* (2013.01); *H05K 7/1438* (2013.01)

(58) Field of Classification Search
USPC .................................. 361/759, 752, 726, 740
See application file for complete search history.

(56) References Cited

U.S. PATENT DOCUMENTS

| 5,982,627 A * | 11/1999 | Haughton | ............... G06F 1/184 206/706 |
| 6,957,979 B2 * | 10/2005 | Welsh | ................. H05K 7/1409 439/545 |

* cited by examiner

*Primary Examiner* — Andargie M Aychillhum
(74) *Attorney, Agent, or Firm* — Clements Bernard PLLC; Christopher L. Bernard; Lawrence A. Baratta, Jr.

(57) ABSTRACT

A latch assembly operable for securing an electronic circuit card in a chassis such that connectors associated with the electronic circuit card and a backplane of the chassis are properly coupled, the latch assembly including: an elongate handle structure, wherein a proximal end of the elongate handle structure defines a hole and includes a protruding portion that is configured to engage a recess or lip associated with the chassis, and wherein a distal end of the elongate handle structure includes a handle portion; a spring structure partially obstructing the hole defined by the proximal end of the elongate handle structure; and a rotation member disposed through the hole and configured to engage the electronic circuit card, wherein the spring structure partially obstructing the hole contacts a portion of the rotation member.

18 Claims, 7 Drawing Sheets

LOW PROFILE COMPLIANT LATCH ASSEMBLY AND ELECTRONIC CIRCUIT CARD AND CHASSIS INCORPORATING SAME

FIELD OF THE DISCLOSURE

The present disclosure relates generally to an electronic circuit card and chassis, such as those used in the optical networking field. More specifically, the present disclosure relates to a low profile compliant latch assembly for use with such an electronic circuit card and chassis.

BACKGROUND OF THE DISCLOSURE

In the optical networking field and others, electronic components, or electronic circuit cards, including faceplates are typically inserted into a shelf assembly, or chassis, including a backplane. Typically, these electronic circuit cards (also referred to as electronic circuit packs) are inserted into the chassis side-by-side in a vertical orientation, although other configurations are possible, such as side-by-side in a horizontal orientation, for example. When inserted, connectors on the back of each electronic circuit card engage connectors on the backplane, completing the desired connections. In 25G+ optical networking systems, for example, it is desirable that the connectors are fully engaged (i.e., "fully seated" or "bottomed out"), given a range of manufacturing and assembly tolerances associated with the various components. Thus, a variety of latch assemblies have been designed to lock the electronic circuit cards in place, most of which are non-compliant, or are compliant but bulky. In this context, compliance refers to the ability of the latch assemblies to properly position an electronic circuit card while accommodating the varying manufacturing and assembly tolerances present.

Thus, it is desirable that a latch assembly firmly hold the associated electronic circuit card in place, be compliant, and have a minimal footprint so that faceplate area and electronic circuit card, or port, density can be maximized. It is also desirable that the latch assembly apply the minimal force required to fully engage the connectors so that the connectors are not damaged.

Most conventional latch assemblies are non-compliant and their use leads to unacceptable electrical performance through the backplane and/or undesirable stressing of the associated electronic circuit card and chassis. Conventional compliant latch assemblies are typically bulky, including compression springs loaded into the associated faceplate or the like, thereby disadvantageously sacrificing port density.

Thus, what is still needed in the art is a latch assembly that properly positions and firmly holds the associated electronic circuit card in place, that is compliant to accommodate varying manufacturing and assembly tolerances, and that has a minimal footprint such that faceplate area and port density is maximized.

BRIEF SUMMARY OF THE DISCLOSURE

In various exemplary embodiments, the present disclosure provides a low profile compliant latch assembly that incorporates an internal leaf spring, compliant portion, and/or compliant material that allows the latch assembly to properly and adequately secure an electronic circuit card in a chassis while accommodating varying manufacturing and assembly tolerances, both while maintaining a minimal footprint.

In one exemplary embodiment, the present invention provides a latch assembly operable for securing an electronic circuit card in a chassis such that connectors associated with the electronic circuit card and a backplane of the chassis are properly coupled, the latch assembly including: an elongate handle structure, wherein a proximal end of the elongate handle structure defines a hole and includes a protruding portion that is configured to engage a recess or lip associated with the chassis, and wherein a distal end of the elongate handle structure includes a handle portion; an elongate spring structure disposed within or adjacent to the elongate handle structure, wherein a distal end of the elongate spring structure is coupled to the distal end of the elongate handle structure, and wherein a proximal end of the elongate spring structure partially obstructs the hole defined by the proximal end of the elongate handle structure; and a rotation member disposed through the hole and configured to engage the electronic circuit card, wherein the proximal end of the elongate spring structure that partially obstructs the hole contacts a portion of the rotation member. A diameter of the hole is greater than a diameter of a portion of the rotation member that is disposed within the hole. When the elongate handle structure is rotated about the rotation member by actuation of the handle portion of the elongate handle structure, the protruding portion of the elongate handle structure engages the recess or lip associated with the chassis and the elongate spring structure resists linear movement of the rotation member within the hole, thereby biasing the electronic circuit card into the chassis. Optionally, the elongate handle structure includes: a first side wall disposed on a first side of the elongate spring structure; a second side wall disposed on a second side of the elongate spring structure opposite the first side of the elongate spring structure; and a spacer member disposed between the first side wall and the second side wall, wherein the spacer member is one of separate from and integrally formed with the elongate spring structure, and wherein the spacer member is operable to separate the first side wall from the second side wall by a predetermined distance such that the proximal end of the elongate spring structure can deflect freely within the elongate handle structure. Optionally, the spacer member defines a hole that is coincident with the hole defined by the proximal end of the elongate handle structure, and wherein the hole defined by the spacer member has a diameter that is greater than the hole defined by the proximal end of the elongate handle structure. Preferably, the elongate spring structure is a leaf spring. Preferably, the rotation member is a shoulder screw that rotatably couples the elongate handle structure to the electronic circuit card. The latch assembly also includes a trigger mechanism rotatably coupled to the elongate handle structure, wherein the trigger mechanism includes a hook portion that is configured to engage a recess or lip associated with the electronic circuit card, thereby preventing rotation of the elongate handle structure with respect to the electronic circuit card. The trigger mechanism is biased by a spring that is coupled to the elongate handle structure.

In another exemplary embodiment, the present invention provides an electronic circuit card configured to be secured in a chassis such that connectors associated with the electronic circuit card and a backplane of the chassis are properly coupled, the electronic circuit card including: a housing; one or more electronic components disposed within the housing; and a latch assembly coupled to the housing, wherein the latch assembly includes: an elongate handle structure, wherein a proximal end of the elongate handle structure defines a hole and includes a protruding portion that is configured to engage a recess or lip associated with the chassis, and wherein a distal end of the elongate handle structure includes a handle portion; an elongate spring structure disposed within or adjacent to the elongate handle structure, wherein a distal end of the elongate spring structure is coupled to the distal end of the elongate handle structure, and wherein a proximal end of the elongate spring structure partially obstructs the hole defined by the proximal end of the elongate handle structure; and a rotation member disposed through the hole and configured to engage the housing, wherein the proximal end of the elongate spring structure that partially obstructs the hole contacts a portion of the rotation member. A diameter of the hole is greater than a diameter of a portion of the rotation member that is disposed within the hole. When the elongate handle structure is rotated about the rotation member by actuation of the handle portion of the elongate handle structure, the protruding portion of the elongate handle structure engages the recess or lip associated with the chassis and the elongate spring structure resists linear movement of the rotation member within the hole, thereby biasing the housing into the chassis. Optionally, the elongate handle structure includes: a first side wall disposed on a first side of the elongate spring structure; a second side wall disposed on a second side of the elongate spring structure opposite the first side of the elongate spring structure; and a spacer member disposed between the first side wall and the second side wall, wherein the spacer member is one of separate from and integrally formed with the elongate spring structure, and wherein the spacer member is operable to separate the first side wall from the second side wall by a predetermined distance such that the proximal end of the elongate spring structure can deflect freely within the elongate handle structure. Optionally, the spacer member defines a hole that is coincident with the hole defined by the proximal end of the elongate handle structure, and wherein the hole defined by the spacer member has a diameter that is greater than the hole defined by the proximal end of the elongate handle structure. Preferably, the elongate spring structure is a leaf spring. Preferably, the rotation member is a shoulder screw that rotatably couples the elongate handle structure to the housing. The latch assembly also includes a trigger mechanism rotatably coupled to the elongate handle structure, wherein the trigger mechanism includes a hook portion that is configured to engage a recess or lip associated with the housing, thereby preventing rotation of the elongate handle structure with respect to the housing. The trigger mechanism is biased by a spring that is coupled to the elongate handle structure.

In a further exemplary embodiment, the present invention provides an electronic chassis, including: a shelf structure; a backplane disposed within the shelf structure, wherein the backplane includes at least one connector; and an electronic circuit card disposed within the shelf structure, wherein the electronic circuit card includes at least one connector coupled to the at least one connector of the backplane, wherein the electronic circuit card includes: a housing; one or more electronic components disposed within the housing; and a latch assembly coupled to the housing, wherein the latch assembly includes: an elongate handle structure, wherein a proximal end of the elongate handle structure defines a hole and includes a protruding portion that is configured to engage a recess or lip associated with the shelf structure, and wherein a distal end of the elongate handle structure includes a handle portion; an elongate spring structure disposed within or adjacent to the elongate handle structure, wherein a distal end of the elongate spring structure is coupled to the distal end of the elongate handle structure, and wherein a proximal end of the elongate spring structure partially obstructs the hole defined by the proximal end of the elongate handle structure; and a rotation member disposed through the hole and configured to engage the housing, wherein the proximal end of the elongate spring structure that partially obstructs the hole contacts a portion of the rotation member. A diameter of the hole is greater than a diameter of a portion of the rotation member that is disposed within the hole. When the elongate handle structure is rotated about the rotation member by actuation of the handle portion of the elongate handle structure, the protruding portion of the elongate handle structure engages the recess or lip associated with the shelf structure and the elongate spring structure resists linear movement of the rotation member within the hole, thereby biasing the housing into the shelf structure. The latch assembly also includes a trigger mechanism rotatably coupled to the elongate handle structure, wherein the trigger mechanism includes a hook portion that is configured to engage a recess or lip associated with the housing, thereby preventing rotation of the elongate handle structure with respect to the housing.

In a still further exemplary embodiment, the present invention provides a latch assembly operable for securing an electronic circuit card in a chassis such that connectors associated with the electronic circuit card and a backplane of the chassis are properly coupled, the latch assembly including: an elongate handle structure, wherein a proximal end of the elongate handle structure defines a hole and includes a protruding portion that is configured to engage a recess or lip associated with the chassis, and wherein a distal end of the elongate handle structure includes a handle portion; a spring structure partially obstructing the hole defined by the proximal end of the elongate handle structure; and a rotation member disposed through the hole and configured to engage the electronic circuit card, wherein the spring structure partially obstructing the hole contacts a portion of the rotation member. Optionally, the spring structure is an elastomeric structure disposed within or adjacent to the hole. Alternatively, the spring structure is a manufactured compliant portion of the elongate handle structure. A diameter of the hole is greater than a diameter of a portion of the rotation member that is disposed within the hole. When the elongate handle structure is rotated about the rotation member by actuation of the handle portion of the elongate handle structure, the protruding portion of the elongate handle structure engages the recess or lip associated with the chassis and the spring structure resists linear movement of the rotation member within the hole, thereby biasing the electronic circuit card into the chassis. Preferably, the rotation member is a shoulder screw that rotatably couples the elongate handle structure to the electronic circuit card. The latch assembly also includes a trigger mechanism rotatably coupled to the elongate handle structure, wherein the trigger mechanism includes a hook portion that is configured to engage a recess or lip associated with the electronic circuit card, thereby preventing rotation of the elongate handle structure with respect to the electronic circuit card. The trigger mechanism is biased by a spring that is coupled to the elongate handle structure.

BRIEF DESCRIPTION OF THE DRAWINGS

The present disclosure is illustrated and described herein with reference to the various drawings, in which like reference numbers are used to denote like assembly components, as appropriate, and in which.

DETAILED DESCRIPTION OF THE DISCLOSURE

Again, in various exemplary embodiments, the present disclosure provides a low profile compliant latch assembly that incorporates an internal leaf spring, compliant portion, and/or compliant material that allows the latch assembly to properly and adequately secure an electronic circuit card in a chassis while accommodating varying manufacturing and assembly tolerances, both while maintaining a minimal footprint.

Figure 1:
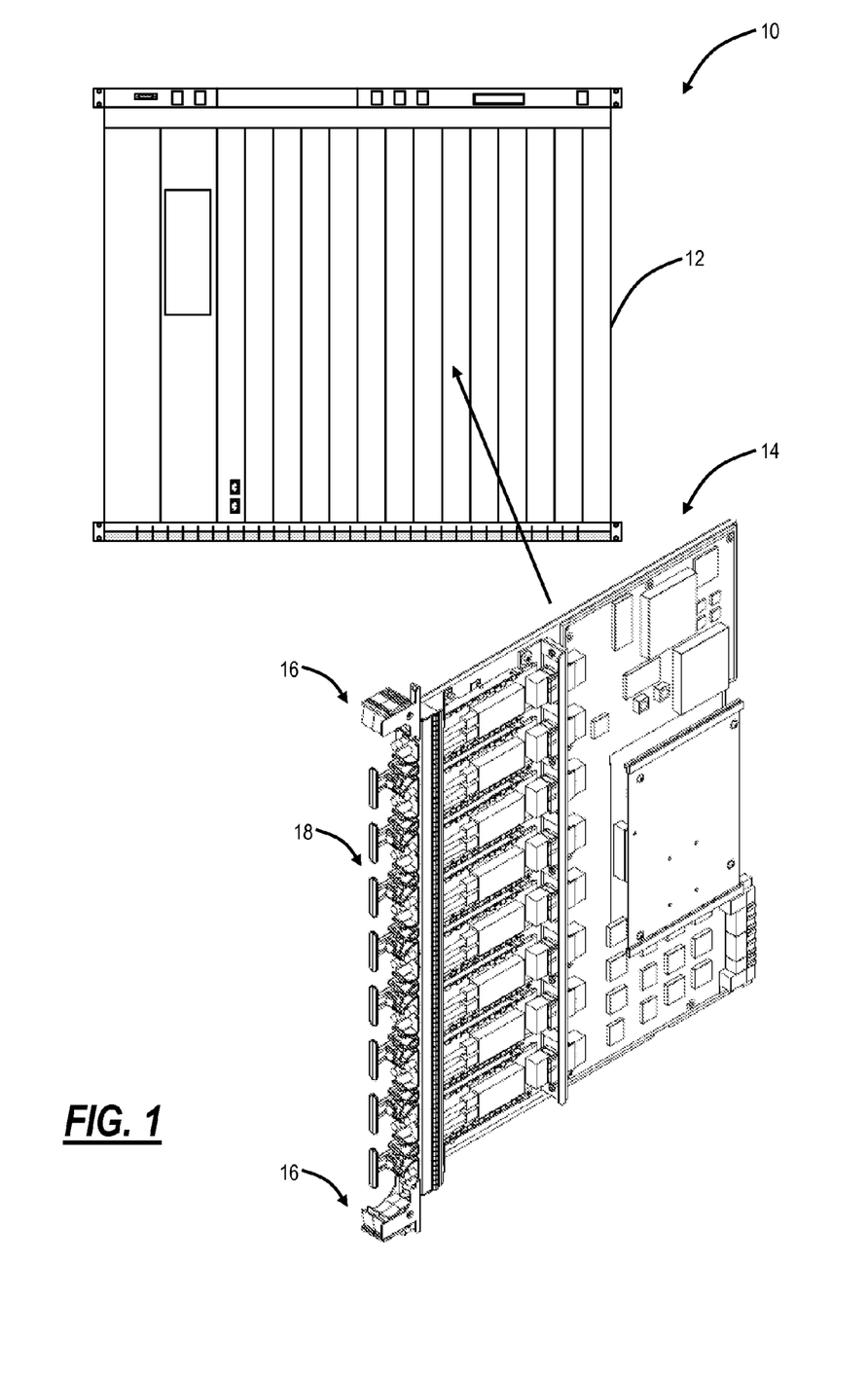
FIG. 1 is a schematic view illustrating a chassis utilizing the electronic circuit cards and latch assemblies of the present disclosure, including a perspective view illustrating an exemplary electronic circuit card.
Figure 2:
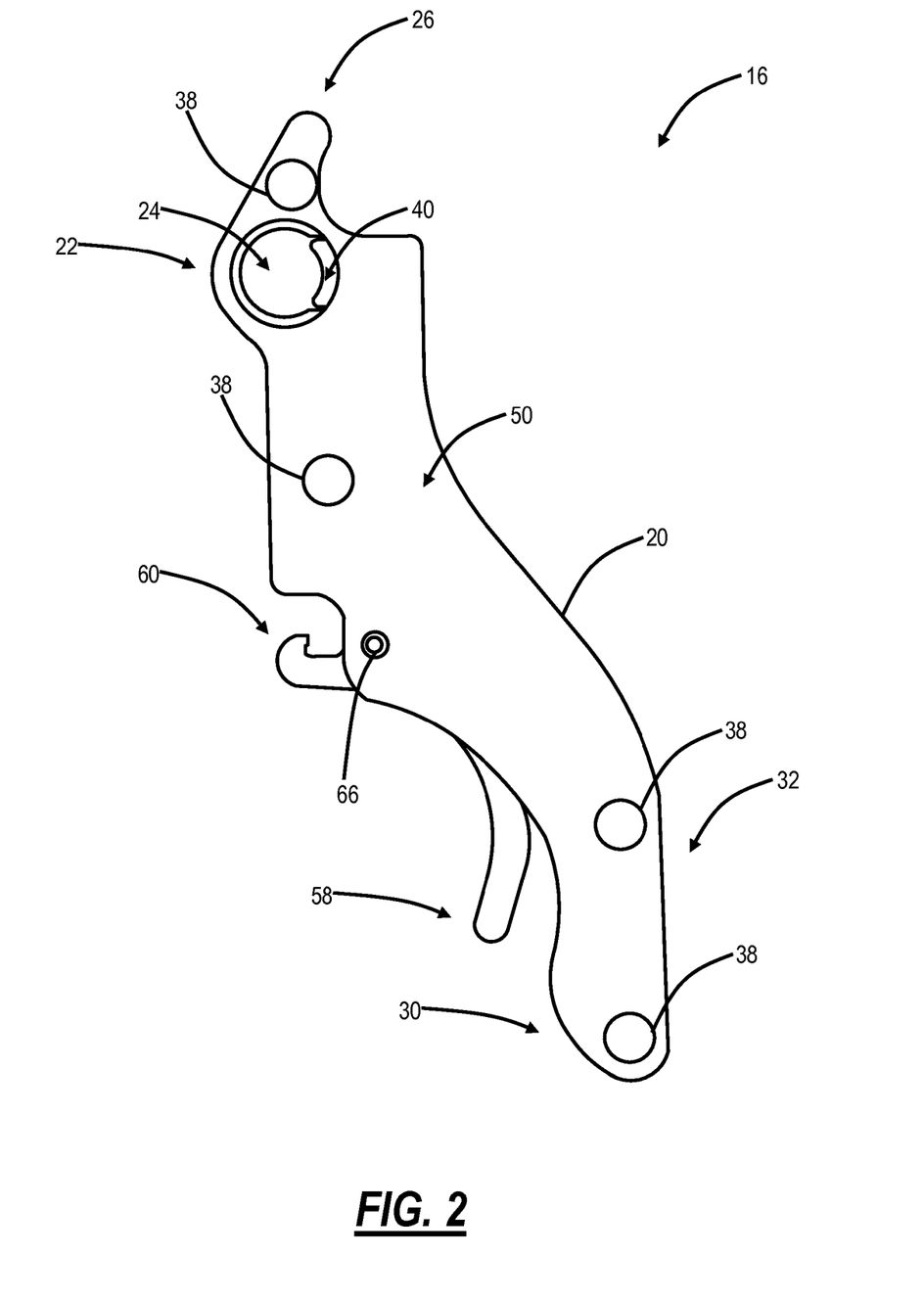
FIG. 2 is a planar side view illustrating one exemplary embodiment of the latch assembly of the present disclosure.
Figure 3:
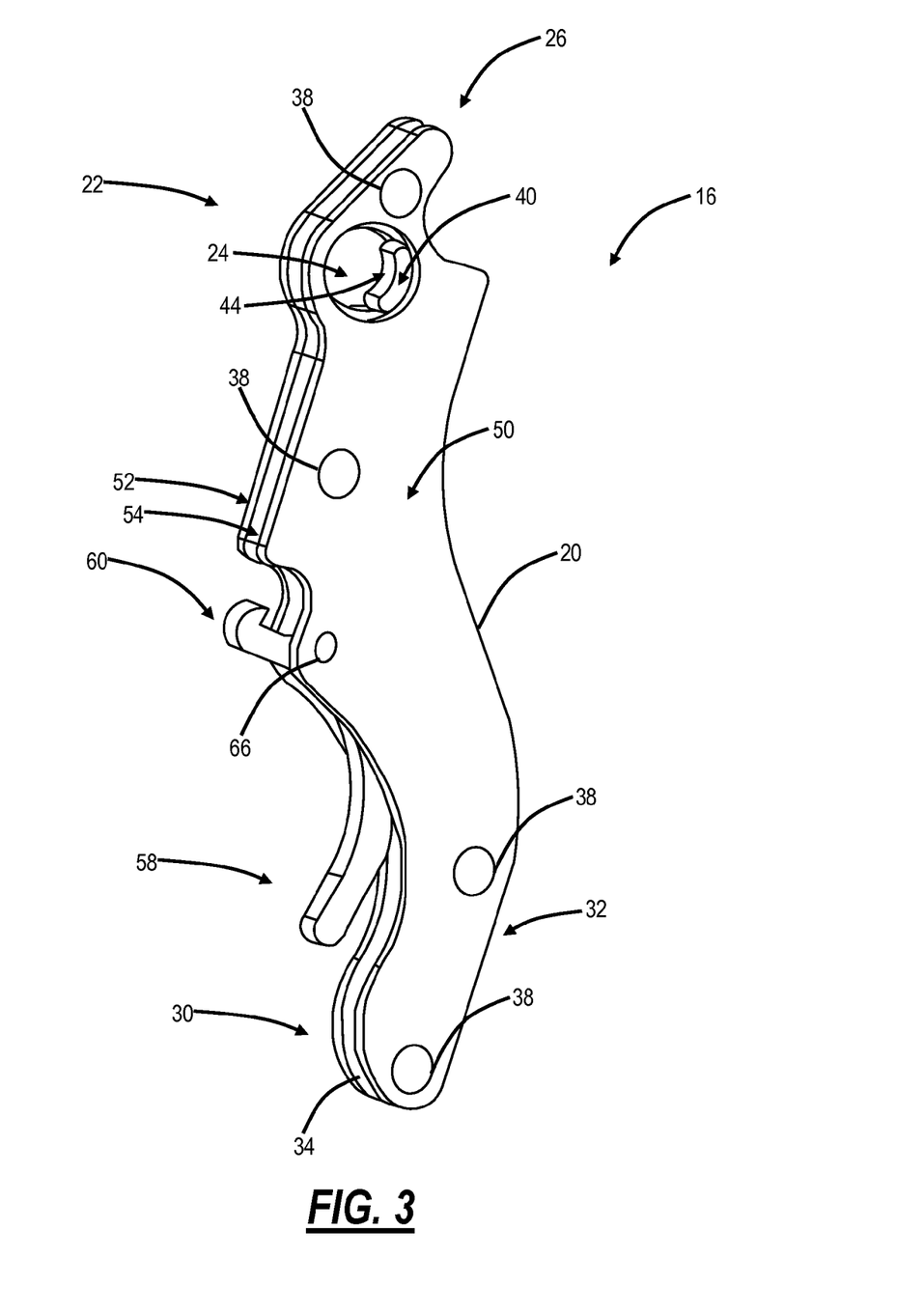
FIG. 3 is a perspective view illustrating one exemplary embodiment of the latch assembly of the present disclosure.
Figure 4:
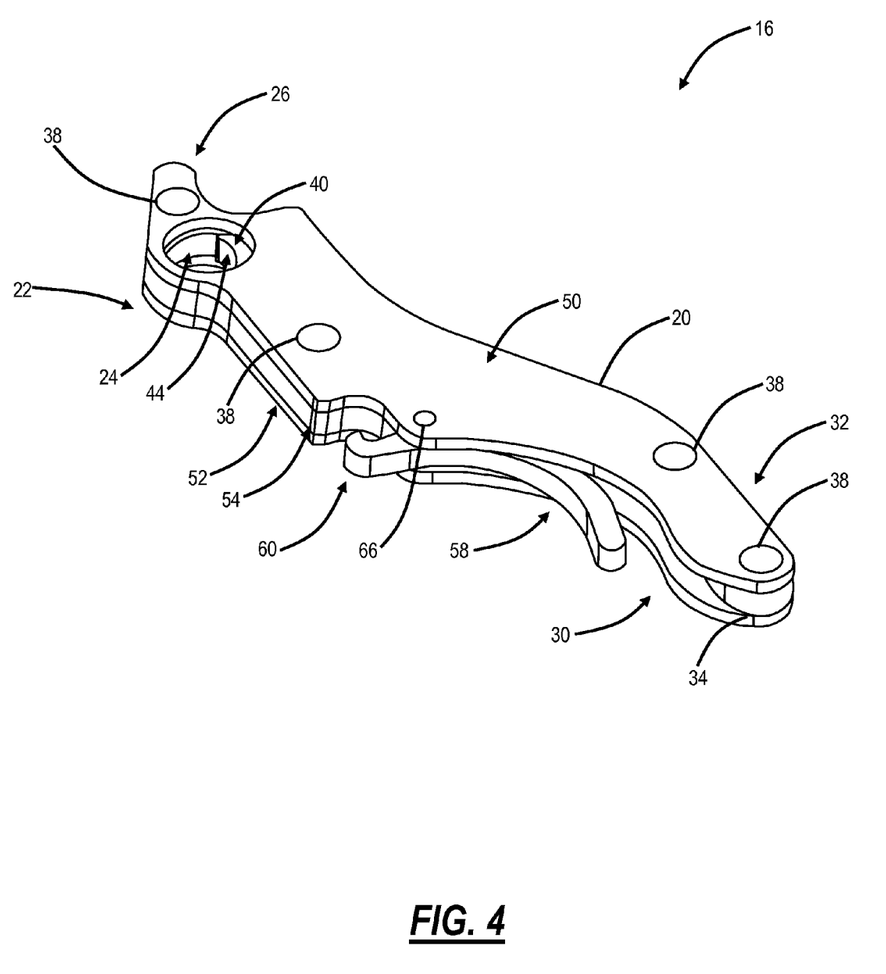
FIG. 4 is another perspective view illustrating one exemplary embodiment of the latch assembly of the present disclosure.
Figure 5:
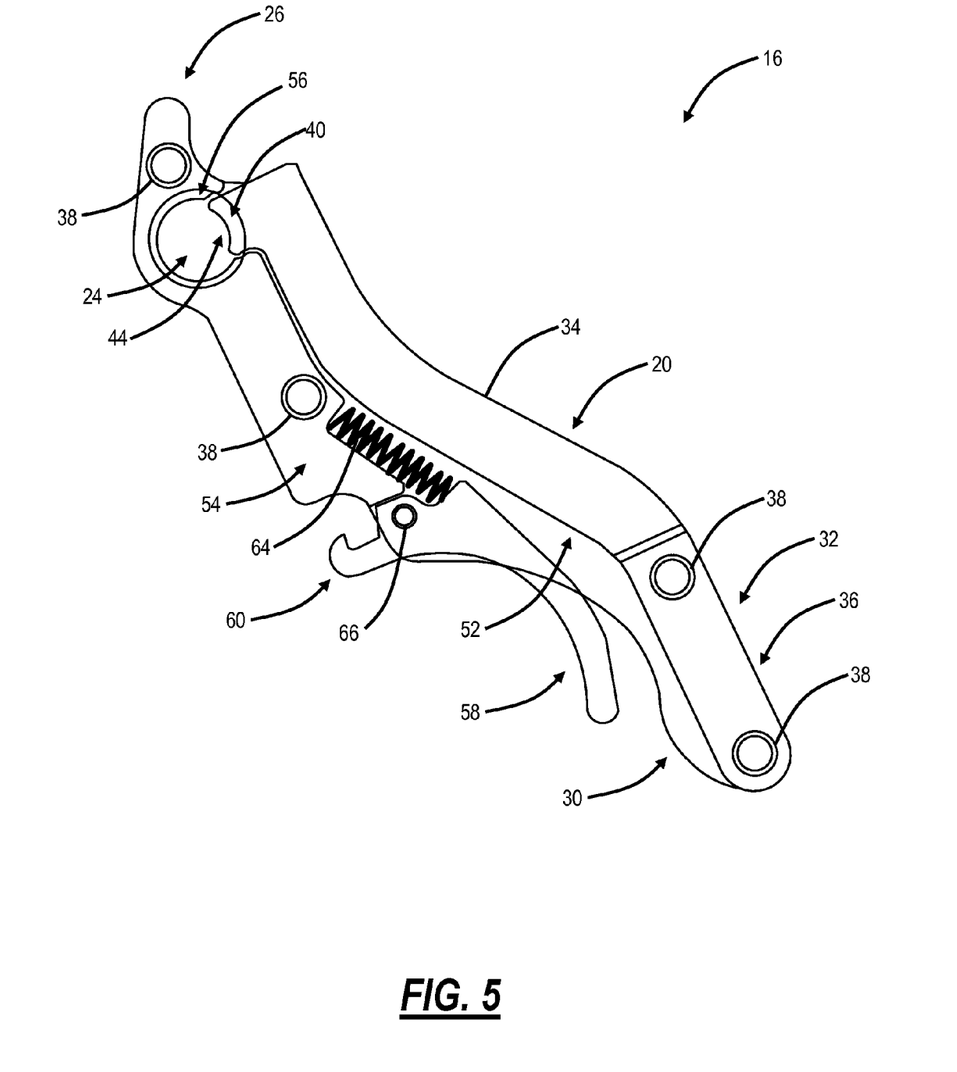
FIG. 5 is an internal planar side view illustrating one exemplary embodiment of the latch assembly of the present disclosure.
Figure 6:
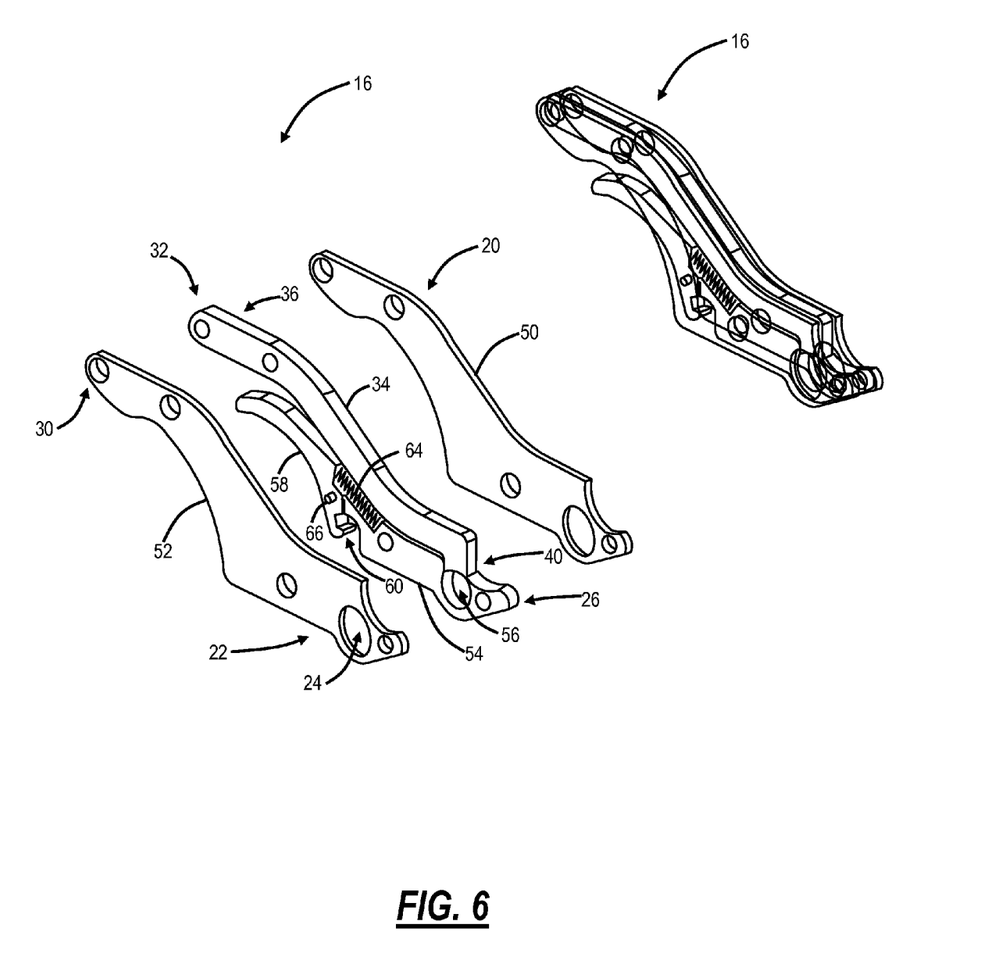
FIG. 6 is an exploded perspective view illustrating one exemplary embodiment of the latch assembly of the present disclosure.

Referring specifically to FIG. 1, an electronic chassis 10, such as that used in an optical networking system, is illustrated. The chassis 10 includes a shelf structure 12 that houses a plurality of electronic circuit cards 14 in a side-by-side vertical orientation, for example. Each of the electronic circuit cards 14 is held in the shelf structure 12, in part, by a pair of latch assemblies (such as a latch assembly 16 of the present disclosure), one latch assembly disposed at the top of the faceplate 18 of the electronic circuit card 14 and one latch assembly disposed at the bottom of the faceplate 18 of the electronic circuit card. Connectors on the back of each electronic circuit card 14 engage connectors on the backplane of the chassis 10, completing the desired connections. In 25G+ optical networking systems, for example, it is desirable that the connectors are fully engaged (i.e., "fully seated" or "bottomed out"), given a range of manufacturing and assembly tolerances associated with the various components. Thus, it is desirable that the latch assemblies provide some degree of spring force to bias the electronic circuit cards 14 into the shelf structure 12, while maintaining compliance and a minimal footprint.

Figure 7A:
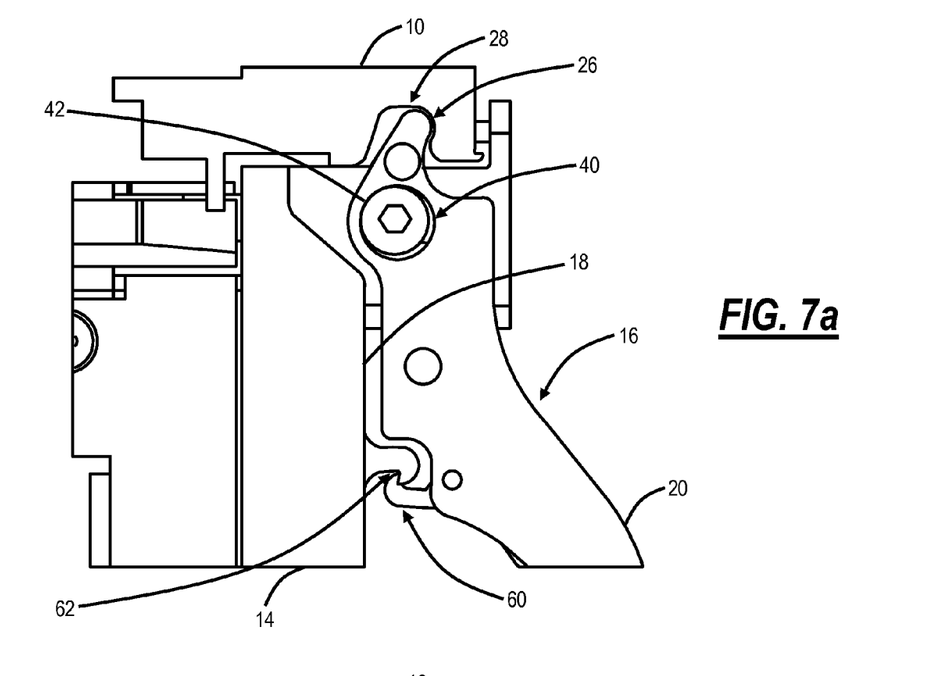
FIGS. 7a and 7b are schematic views illustrating the operation of the latch assemblies of the present disclosure.
Figure 7B:
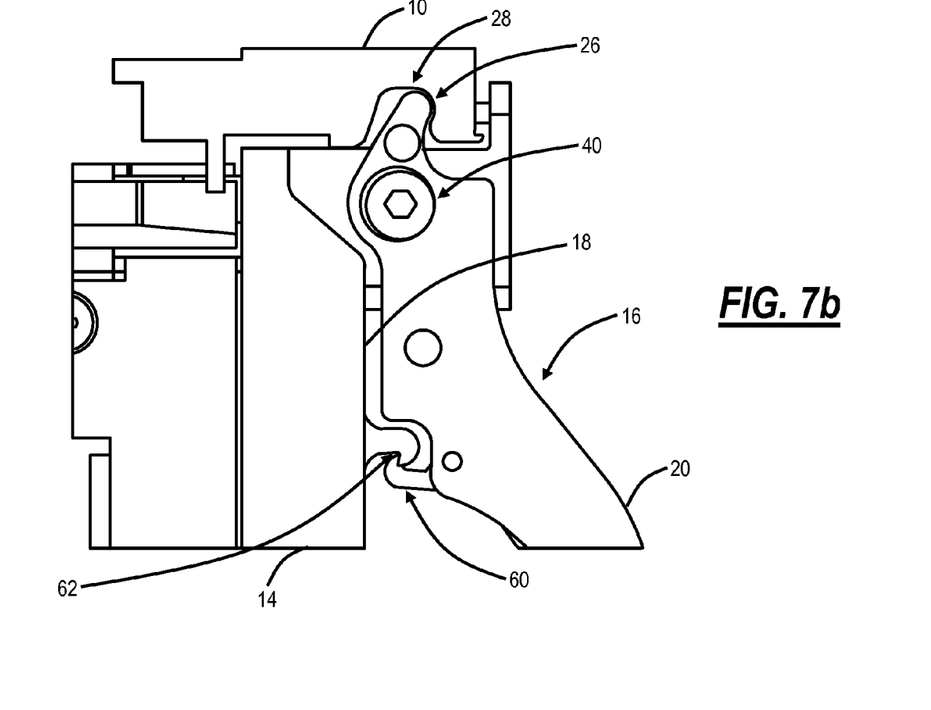

Referring now specifically to FIGS. 2-6, in one exemplary embodiment, the latch assembly 16 of the present disclosure includes an elongate handle structure 20. This elongate handle structure 20 may be made of a substantially rigid metallic material (such as stainless steel or the like), a substantially rigid ceramic material, a substantially rigid plastic material, etc. Preferably, the elongate handle structure 20 has a thickness of less than about 10 mm, although any suitable dimensions may be utilized. A proximal end 22 of the elongate handle structure 20 defines a hole 24 and includes a protruding portion 26 that is configured to engage a recess or lip 28 (FIGS. 7a and 7b) associated with the chassis 10 (FIGS. 1, 7a, and 7b). A distal end 30 of the elongate handle structure 20 includes a handle portion 32 by which a user may grasp and actuate the latch assembly 16.

The latch assembly 16 also includes elongate spring structure 34 disposed within or adjacent to the elongate handle structure 20. This elongate spring structure 34 may be made of a substantially rigid metallic material (such as stainless steel or the like), a substantially rigid plastic material, etc. that provides some degree of deflection when a force is applied to it, due to its composition and/or length. Preferably, the elongate spring structure 34 has a thickness of less than about 5 mm, although any suitable dimensions may be utilized. For example, the thickness of the elongate spring structure 34 may vary along its length. A distal end 36 of the elongate spring structure 34 is coupled to the distal end 30 of the elongate handle structure 32 via a plurality of rivets 38 or the like. A proximal end 40 of the elongate spring structure 34 partially obstructs the hole 24 defined by the proximal end 22 of the elongate handle structure 20, for example by protruding partially into and/or across the hole 24 defined by the proximal end 22 of the elongate handle structure 20.

A rotation member 42 (FIGS. 7a and 7b), such as a shoulder screw or the like, is disposed through the hole 24 defined by the proximal end 22 of the elongate handle structure 20 and is configured to engage the electronic circuit card 14 (FIGS. 1, 7a, and 7b). This allows the elongate handle structure 20 to rotate about the rotation member 42 and thereby rotate with respect to the electronic circuit card 14. Preferably, the diameter of the hole 24 defined by the proximal end 22 of the elongate handle structure 20 is greater than the diameter of a portion of the rotation member 42 that is disposed within the hole 24 defined by the proximal end 22 of the elongate handle structure 20, such that there is some linear movement between the two components absent other components preventing this linear movement. It is this linear movement that allows the latch assembly 17 to accommodate varying manufacturing and assembly tolerances associated with the electronic circuit card 14 and chassis 10. To accomplish this purpose, the proximal end 40 of the elongate spring structure 34 that partially obstructs the hole 24 defined by the proximal end 22 of the elongate handle structure 20 contacts a portion of the rotation member 42, thus coupling the shoulder screw or the like to the leaf spring or the like. The proximal end 40 of the elongate spring structure 34 that partially obstructs the hole 24 defined by the proximal end 22 of the elongate handle structure 20 may include a recess or saddle structure 44 that assists in stabilizing this coupling.

In operation, when the elongate handle structure 20 is rotated about the rotation member 42 by user actuation of the handle portion 32 of the elongate handle structure 20, the protruding portion 26 of the elongate handle structure 20 engages the recess or lip 28 associated with the chassis 10 and the elongate spring structure 34 resists linear movement of the rotation member 42 within the hole 24 defined by the proximal end 22 of the elongate handle structure 20, thereby biasing the electronic circuit card 14 into the chassis 10.

In this exemplary embodiment, the elongate handle structure 20 includes a first side wall 50 disposed on a first side of the elongate spring structure 34 and a second side wall 52 disposed on a second side of the elongate spring structure 34 opposite the first side of the elongate spring structure. A spacer member 54 is disposed between the first side wall 50 and the second side wall 52 adjacent to the elongate spring structure 34, and held in place via rivets 38 or the like. The spacer member 54 may have any suitable size, shape, and dimensions. The spacer member 54 is operable for separating the first side wall 50 from the second side wall 52 by a predetermined distance such that the proximal end 40 of the elongate spring structure 34 can deflect freely within the elongate handle structure 20. Optionally, the spacer member 54 defines a hole 56 that is coincident with the hole 24 defined by the proximal end 22 of the elongate handle structure 20. Optionally, the hole 56 defined by the spacer member 54 has a diameter that is greater than the hole 24 defined by the proximal end 22 of the elongate handle structure 20.

The latch assembly 16 further includes a trigger mechanism 58 rotatably coupled to the elongate handle structure 20 via a dowel pin 66 or the like. The trigger mechanism 58 includes a hook portion 60 that is configured to engage a recess or lip 62 associated with the electronic circuit card 14, thereby preventing rotation of the elongate handle structure 20 with respect to the electronic circuit card 14 when the trigger mechanism 58 is actuated. Optionally, the trigger mechanism 58 is biased by a compression spring 64 that is coupled to the elongate handle structure 20.

In general, it is contemplated that each latch assembly 16 will be able to apply a spring force of about 50 lbs, for example.

Referring now specifically to FIGS. 7a and 7b, the operation of the latch assembly of the present disclosure is illustrated. FIG. 7a shows an electronic circuit card 14 disposed within a chassis 10 with an essentially un-deformed leaf spring, representing a shelf depth at the highest tolerance range and the electronic circuit card 14 at the lowest tolerance range. FIG. 7b shows an electronic circuit card 14 disposed within a chassis 10 with a deformed leaf spring, representing a shelf depth at the lowest tolerance range and the electronic circuit card 14 at the highest tolerance range.

In another exemplary embodiment, the latch assembly 16 includes an elongate handle structure 20, wherein a proximal end 22 of the elongate handle structure 20 defines a hole 24 and includes a protruding portion 26 that is configured to engage a recess or lip 28 associated with the chassis 10, and wherein a distal end 30 of the elongate handle structure 20 includes a handle portion 32. The latch assembly 16 also includes a spring structure partially obstructing the hole 24 defined by the proximal end 22 of the elongate handle structure 20. The latch assembly 16 further includes a rotation member 42 disposed through the hole 24 defined by the proximal end 22 of the elongate handle structure 20 and configured to engage the electronic circuit card 14, wherein the spring structure partially obstructing the hole 24 defined by the proximal end 22 of the elongate handle structure 20 contacts a portion of the rotation member 42. Optionally, the spring structure is an elastomeric structure, such as an O-ring or bushing, disposed within or adjacent to the hole 24 defined by the proximal end 22 of the elongate handle structure 20. Alternatively, the spring structure is a manufactured compliant portion of the elongate handle structure 20. Preferably, absent the spring structure, the diameter of the hole 24 defined by the proximal end 22 of the elongate handle structure 20 is greater than a diameter of a portion of the rotation member 42 that is disposed within the hole 24 defined by the proximal end 22 of the elongate handle structure 20.

When the elongate handle structure 20 is rotated about the rotation member 42 by actuation of the handle portion 32 of the elongate handle structure 20, the protruding portion 26 of the elongate handle structure 20 engages the recess or lip 28 associated with the chassis 10 and the spring structure resists linear movement of the rotation member 42 within the hole 24 defined by the proximal end 22 of the elongate handle structure 20, thereby biasing the electronic circuit card 14 to which the rotation member 42 is engaged into the chassis 10. Preferably, the rotation member 42 is a shoulder screw that rotatably couples the elongate handle structure 20 to the electronic circuit card 14.

The latch assembly 16 still further includes a trigger mechanism 58 rotatably coupled to the elongate handle structure 20, wherein the trigger mechanism 58 includes a hook portion 60 that is configured to engage a recess or lip 62 associated with the electronic circuit card 14, thereby preventing rotation of the elongate handle structure 20 with respect to the electronic circuit card 14. The trigger mechanism 58 is biased by a spring 64 that is coupled to the elongate handle structure 20.

Although the present disclosure is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims, without limitation.

What is claimed is:

1. A latch assembly operable for securing an electronic circuit card in a chassis such that connectors associated with the electronic circuit card and a backplane of the chassis are properly coupled, the latch assembly comprising:
an elongate handle structure, wherein a proximal end of the elongate handle structure defines a hole and includes a protruding portion that is configured to engage a recess or lip associated with the chassis, and wherein a distal end of the elongate handle structure includes a handle portion; an elongate spring structure disposed within or adjacent to the elongate handle structure, wherein a distal end of the elongate spring structure is coupled to the distal end of the elongate handle structure, and wherein a proximal end of the elongate spring structure partially obstructs the hole defined by the proximal end of the elongate handle structure; and a rotation member disposed through the hole and configured to engage the electronic circuit card, wherein the proximal end of the elongate spring structure that partially obstructs the hole contacts a portion of the rotation member; wherein a diameter of the hole is greater than a diameter of a portion of the rotation member that is disposed within the hole, and wherein, when the elongate handle structure is rotated about the rotation member by actuation of the handle portion of the elongate handle structure, the protruding portion of the elongate handle structure engages the recess or lip associated with the chassis and the elongate spring structure resists linear movement of the rotation member within the hole, thereby biasing the electronic circuit card into the chassis.

2. The latch assembly of claim 1, wherein the elongate handle structure comprises,
a first side wall disposed on a first side of the elongate spring structure,
a second side wall disposed on a second side of the elongate spring structure opposite the first side of the elongate spring structure, and
a spacer member disposed between the first side wall and the second side wall, wherein the spacer member is one of separate from and integrally formed with the elongate spring structure, and wherein the spacer member is operable to separate the first side wall from the second side wall by a predetermined distance such that the proximal end of the elongate spring structure can deflect freely within the elongate handle structure.

3. The latch assembly of claim 2, wherein the spacer member defines a hole that is coincident with the hole defined by the proximal end of the elongate handle structure, and wherein the hole defined by the spacer member has a diameter that is greater than the hole defined by the proximal end of the elongate handle structure.

4. The latch assembly of claim 1, further comprising a trigger mechanism rotatably coupled to the elongate handle structure, wherein the trigger mechanism includes a hook portion that is configured to engage a recess or lip associated with the electronic circuit card, thereby preventing rotation of the elongate handle structure with respect to the electronic circuit card.

5. The latch assembly of claim 4, wherein the trigger mechanism is biased by a spring that is coupled to the elongate handle structure.

6. An electronic circuit card configured to be secured in a chassis such that connectors associated with the electronic circuit card and a backplane of the chassis are properly coupled, the electronic circuit card comprising a housing; one or more electronic components disposed within the housing; and a latch assembly coupled to the housing, wherein the latch assembly comprises, an elongate handle structure, wherein a proximal end of the elongate handle structure defines a hole and includes a protruding portion that is configured to engage a recess or lip associated with the chassis, and wherein a distal end of the elongate handle structure includes a handle portion, an elongate spring structure disposed within or adjacent to the elongate handle structure, wherein a distal end of the elongate spring structure is coupled to the distal end of the elongate handle structure, and wherein a proximal end of the elongate spring structure partially obstructs the hole defined by the proximal end of the elongate handle structure, and a rotation member disposed through the hole and configured to engage the housing, wherein the proximal end of the elongate spring structure that partially obstructs the hole contacts a portion of the rotation member; wherein a diameter of the hole is greater than a diameter of a portion of the rotation member that is disposed within the hole; and wherein, when the elongate handle structure is rotated about the rotation member by actuation of the handle portion of the elongate handle structure, the protruding portion of the elongate handle structure engages the recess or lip associated with the chassis and the elongate spring structure resists linear movement of the rotation member within the hole, thereby biasing the housing into the chassis.

7. The electronic circuit card of claim 6, wherein the elongate handle structure comprises,
    a first side wall disposed on a first side of the elongate spring structure,
    a second side wall disposed on a second side of the elongate spring structure opposite the first side of the elongate spring structure, and
    a spacer member disposed between the first side wall and the second side wall, wherein the spacer member is one of separate from and integrally formed with the elongate spring structure, and wherein the spacer member is operable to separate the first side wall from the second side wall by a predetermined distance such that the proximal end of the elongate spring structure can deflect freely within the elongate handle structure.

8. The electronic circuit card of claim 7, wherein the spacer member defines a hole that is coincident with the hole defined by the proximal end of the elongate handle structure, and wherein the hole defined by the spacer member has a diameter that is greater than the hole defined by the proximal end of the elongate handle structure.

9. The electronic circuit card of claim 6, further comprising a trigger mechanism rotatably coupled to the elongate handle structure, wherein the trigger mechanism includes a hook portion that is configured to engage a recess or lip associated with the housing, thereby preventing rotation of the elongate handle structure with respect to the housing.

10. The electronic circuit card of claim 9, wherein the trigger mechanism is biased by a spring that is coupled to the elongate handle structure.

11. An electronic chassis, comprising: a shelf structure; a backplane disposed within the shelf structure, wherein the backplane includes at least one connector; and an electronic circuit card disposed within the shelf structure, wherein the electronic circuit card includes at least one connector coupled to the at least one connector of the backplane, wherein the electronic circuit card comprises, a housing, one or more electronic components disposed within the housing, and a latch assembly coupled to the housing, wherein the latch assembly comprises, an elongate handle structure, wherein a proximal end of the elongate handle structure defines a hole and includes a protruding portion that is configured to engage a recess or lip associated with the shelf structure, and wherein a distal end of the elongate handle structure includes a handle portion, an elongate spring structure disposed within or adjacent to the elongate handle structure, wherein a distal end of the elongate spring structure is coupled to the distal end of the elongate handle structure, and wherein a proximal end of the elongate spring structure partially obstructs the hole defined by the proximal end of the elongate handle structure, and a rotation member disposed through the hole and configured to engage the housing, wherein the proximal end of the elongate spring structure that partially obstructs the hole contacts a portion of the rotation member; wherein a diameter of the hole is greater than a diameter of a portion of the rotation member that is disposed within the hole; and wherein, when the elongate handle structure is rotated about the rotation member by actuation of the handle portion of the elongate handle structure, the protruding portion of the elongate handle structure engages the recess or lip associated with the shelf structure and the elongate spring structure resists linear movement of the rotation member within the hole, thereby biasing the housing into the shelf structure.

12. The electronic chassis of claim 11, further comprising a trigger mechanism rotatably coupled to the elongate handle structure, wherein the trigger mechanism includes a hook portion that is configured to engage a recess or lip associated with the housing, thereby preventing rotation of the elongate handle structure with respect to the housing.

13. A latch assembly operable for securing an electronic circuit card in a chassis such that connectors associated with the electronic circuit card and a backplane of the chassis are properly coupled, the latch assembly comprising:
    an elongate handle structure, wherein a proximal end of the elongate handle structure defines a hole and includes a protruding portion that is configured to engage a recess or lip associated with the chassis, and wherein a distal end of the elongate handle structure includes a handle portion; a spring structure partially obstructing the hole defined by the proximal end of the elongate handle structure; and a rotation member disposed through the hole and configured to engage the electronic circuit card, wherein the spring structure partially obstructing the hole contacts a portion of the rotation member; wherein, when the elongate handle structure is rotated about the rotation member by actuation of the handle portion of the elongate handle structure, the protruding portion of the elongate handle structure engages the recess or lip associated with the chassis and the spring structure resists linear movement of the rotation member within the hole, thereby biasing the electronic circuit card into the chassis.

14. The latch assembly of claim 13, wherein the spring structure comprises an elastomeric structure disposed within or adjacent to the hole.

15. The latch assembly of claim 13, wherein the spring structure comprises a manufactured compliant portion of the elongate handle structure.

16. The latch assembly of claim 13, wherein a diameter of the hole is greater than a diameter of a portion of the rotation member that is disposed within the hole.

17. The latch assembly of claim 13, further comprising a trigger mechanism rotatably coupled to the elongate handle structure, wherein the trigger mechanism includes a hook portion that is configured to engage a recess or lip associated with the electronic circuit card, thereby preventing rotation of the elongate handle structure with respect to the electronic circuit card.

18. The latch assembly of claim 17, wherein the trigger mechanism is biased by a spring that is coupled to the elongate handle structure.

* * * * *